United States Patent [19]
Evarts et al.

[11] Patent Number: 5,823,378
[45] Date of Patent: Oct. 20, 1998

[54] BREATHER VENT FOR ELECTRICAL ENCLOSURE

[75] Inventors: David A. Evarts, Fairfield; Charles R. Ruskouski, Danbury; John Cutone, Old Lyme, all of Conn.

[73] Assignee: GSEG LLC, Farmington, Conn.

[21] Appl. No.: 826,254

[22] Filed: Mar. 27, 1997

[51] Int. Cl.[6] .................................................. B65D 51/16
[52] U.S. Cl. .................................. 220/374; 220/DIG. 27; 174/50
[58] Field of Search ..................... 220/374, 373, 220/368, 369, 375, DIG. 27; 174/50

[56] References Cited

U.S. PATENT DOCUMENTS

| | | | |
|---|---|---|---|
| 1,920,261 | 8/1933 | Lavender | 220/374 |
| 2,399,384 | 4/1946 | Pross . | |
| 3,696,729 | 10/1972 | Chabala et al. . | |
| 3,952,908 | 4/1976 | Carson | 220/484 |
| 4,658,339 | 4/1987 | Tammerijn et al. . | |
| 4,755,917 | 7/1988 | Bals et al. . | |
| 4,790,445 | 12/1988 | Shibata | 220/374 |
| 5,041,949 | 8/1991 | Hirota et al. . | |
| 5,159,155 | 10/1992 | Masahiko | 220/374 |
| 5,497,308 | 3/1996 | Ohtsuka et al. . | |
| 5,499,734 | 3/1996 | Tessmer . | |

OTHER PUBLICATIONS

Dual–Lite Nema 4X LED Exit Sign Series #0601435 Apr. 1996.
Dual–Lite Nema N4X Series IC #60–1079, Apr. 1989.

*Primary Examiner*—Joseph M. Moy
*Attorney, Agent, or Firm*—Ware, Fressola, Van der Sluys & Adolphson LLP

[57] ABSTRACT

A breather box attaches to the exterior wall of an electrical enclosure. An upper breather opening in the box connects with a vent opening in the wall. A lower breather opening in the box is shielded by a wall spaced therefrom to prevent water entry. A labyrinth in the interior of the box forces ascending water through a series of sharp turns and through a series of constrictions which are followed by expansion chambers. The labyrinth terminates at a liquid exit adjacent the upper wall of the breather box, forcing water to substantially fill the breather box before it can enter the enclosure.

13 Claims, 3 Drawing Sheets

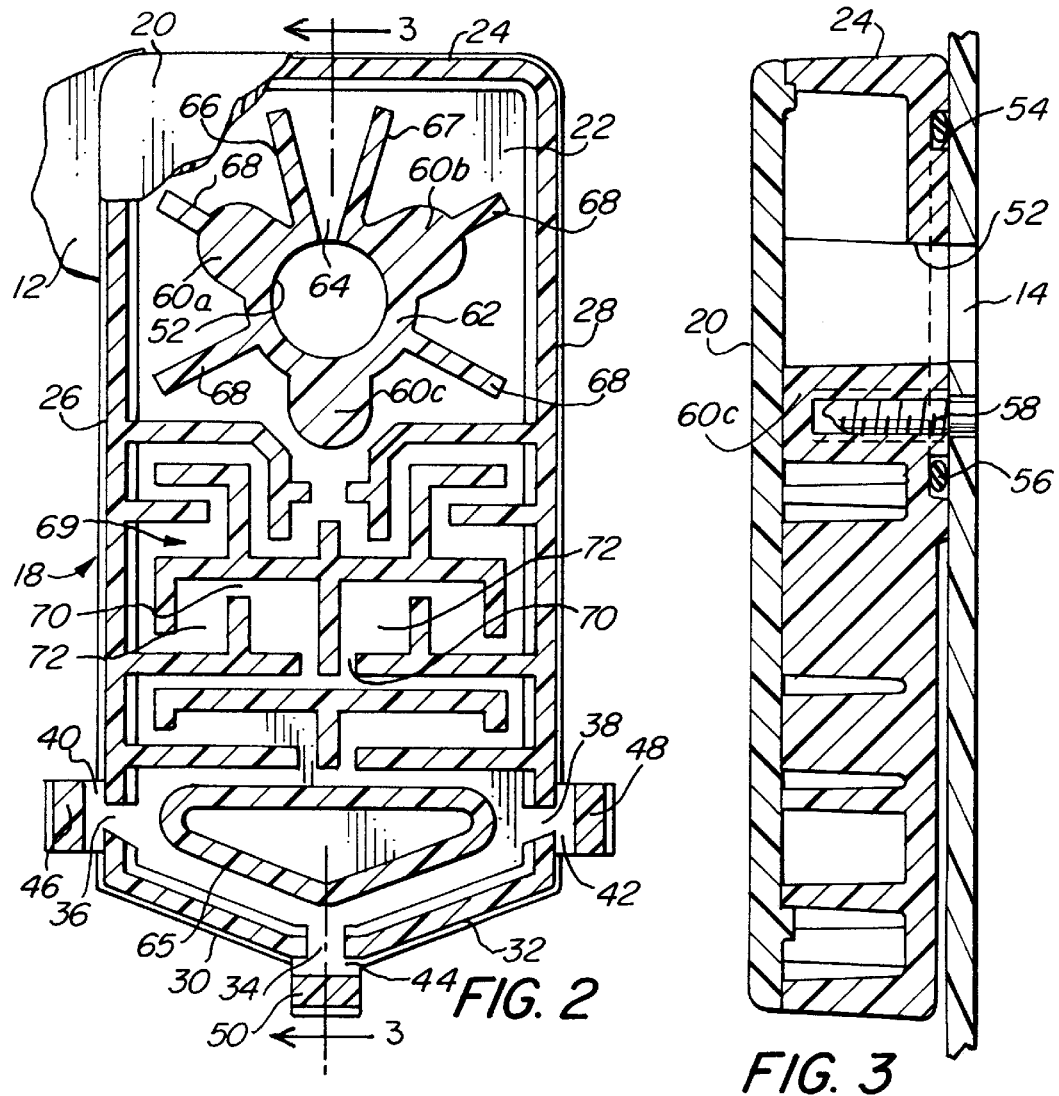
FIG. 2
FIG. 3
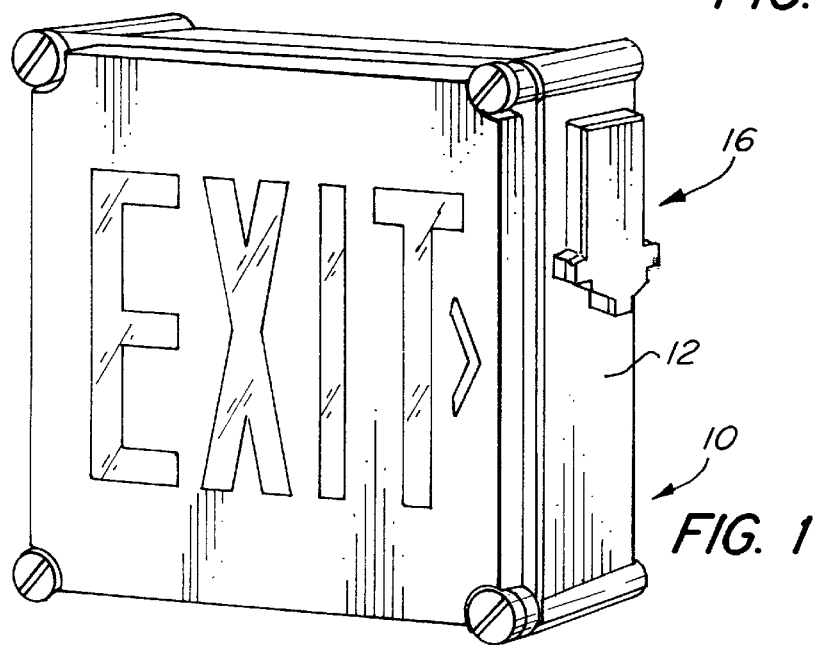
FIG. 1

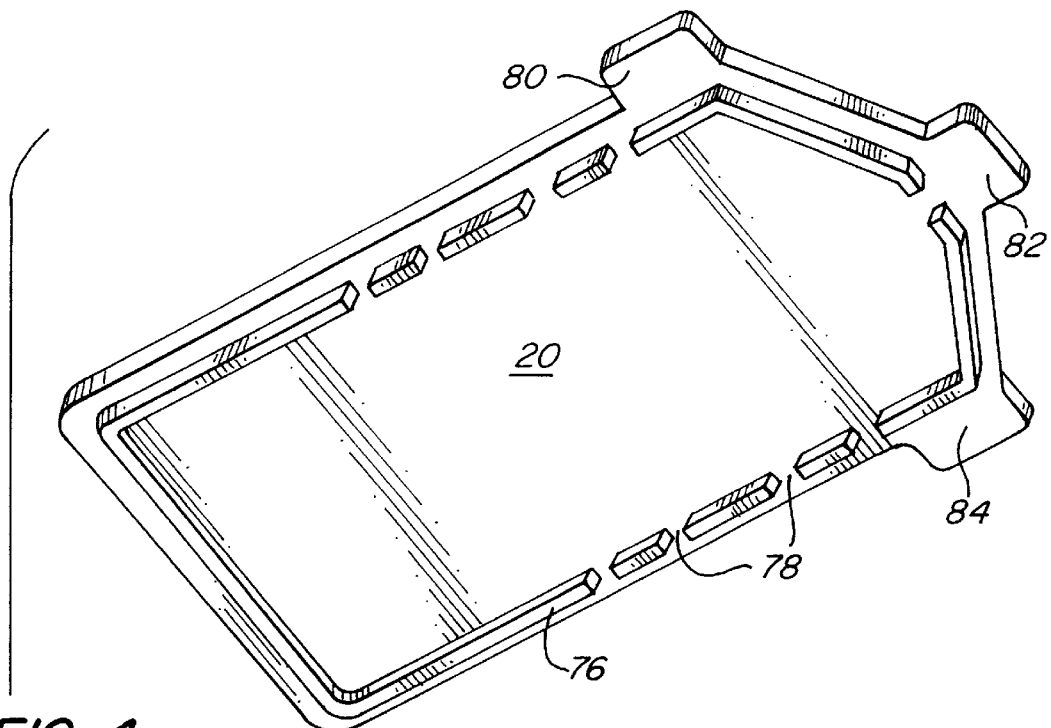
FIG. 4
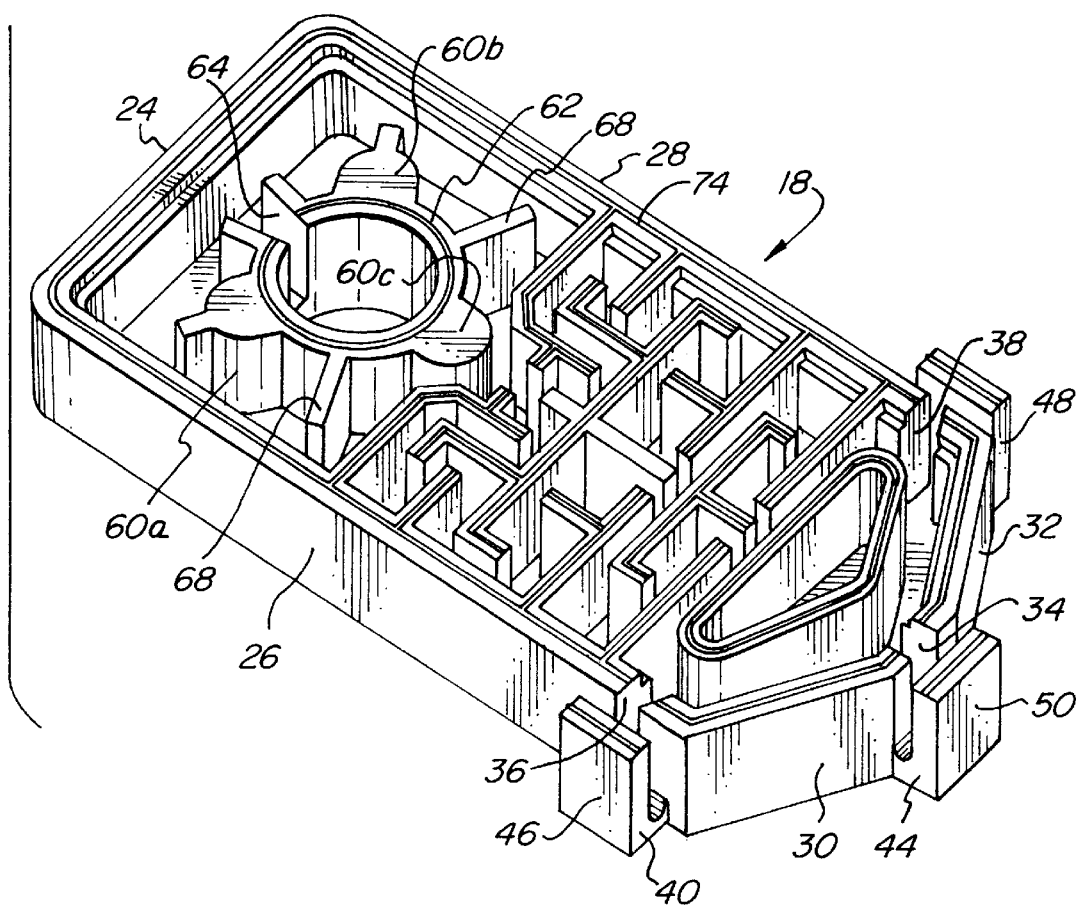

BREATHER VENT FOR ELECTRICAL ENCLOSURE

BACKGROUND OF THE INVENTION

1. Technical Field

This invention relates to electrical enclosures. More particularly, it pertains to a breather vent which permits gas to escape from the enclosure while preventing water from entering.

2. Background Art

Certain electrical enclosures, in particular those of an emergency type, such as exit signs and emergency lighting units, contain an emergency backup power source, e.g., batteries to provide emergency illumination during power failure situations. During charging, the batteries can generate hydrogen gas, a dangerously explosive substance. Other electrical enclosures may contain elements which heat the enclosed air and require ventilation. Furthermore, units of this type are often located in hostile environments. One such example is a food storage area which would be cleaned by water hosing, or an outdoor location subject to wind and storms. Accordingly, both the National Electrical Manufacturers' Association (NEMA) and the Underwriters' Laboratory (UL) have developed tests for assuring compliance of such electrical enclosures with certain minimum safety considerations. The UL 924 battery compartment ventilation test reads as follows:

> 48.1 When a measurement is made to determine if equipment complies with 8.5.1 and 8.5.2, the battery is to be tested with its associated charging equipment. If possible, the test is to be conducted during the Battery Discharge Test, Section 47. If the test is conducted separately from the Battery Discharge Test, using the recharge time specified in 47.7 (g). The maximum hydrogen gas concentration is to be no more than 2 percent by volume when measured during 47.7 (i). Measurements are to be made by sampling the atmosphere inside the battery compartment at 75 and 125 percent of the specified recharge time. Samples of the atmosphere within the battery compartment are to be taken in the uppermost location in the battery compartment by means of an aspirator bulb provided with the concentration measurement equipment.

The UL hose down test reads as follows:

> 35.2.1 The enclosure and its external mechanisms are then to be sprayed by water from a hose having a 1-inch (25.4-mm) inside diameter nozzle that delivers at least 65 gallons (246 L) of water per minute. The water stream is to be directed at the joints of the enclosure from a distance of 10–12 feet (3.0–3.7 m) and is to be moved along the joints or surface at a minimum rate of 4 seconds per linear inch (1.6 s/cm). See also 35.2.2.
>
> 35.2.2 For an enclosure having a test length-height plus width plus depth dimension of 75 inches (1.91 m) or less, the duration of the water stream contact with the enclosure is to be 5 minutes. For an enclosure having a test length exceeding 75 inches (1.91 m), the duration of water stream contact in minutes is to be the test length measured in inches divided by 15 (2.62 times the test length measured in meters).

It is a primary object of the present invention to provide a breather for the vent of an electrical enclosure which is capable of passing both of the seemingly contradictory tests. Other objects, features, and advantages will become apparent from the following description and appended claims.

SUMMARY OF THE INVENTION

The invention comprises a breather in the form of a box which is attached to the exterior vent opening of the electrical enclosure. The breather box has an upper wall and an opening in its upper end which seals to the electrical enclosure vent. The lower end of the breather defines one or more openings, each of such openings having a shield wall associated therewith. The interior of the breather box defines a labyrinth of passages characterized by a series of sharp turns and by multiple flow constrictions, each constriction being followed (relative to an ascending fluid) by an expansion chamber. The labyrinth continues and terminates at a liquid exit adjacent the upper wall of the breather box. In order for water to enter the vent, it would have to substantially completely fill the breather box.

BRIEF DESCRIPTION OF DRAWINGS

FIG. 1 is an isometric view of an exit sign equipped with a breather box in accordance with the invention;

FIG. 2 is an elevational view, partially broken away, of the breather box of the invention;

FIG. 3 is a cross-section taken substantially along the line 3—3 of FIG. 2;

FIG. 4 is an isometric view of the breather box and its cover prior to assembly;

BEST MODE FOR CARRYING OUT THE INVENTION

Figure 7:
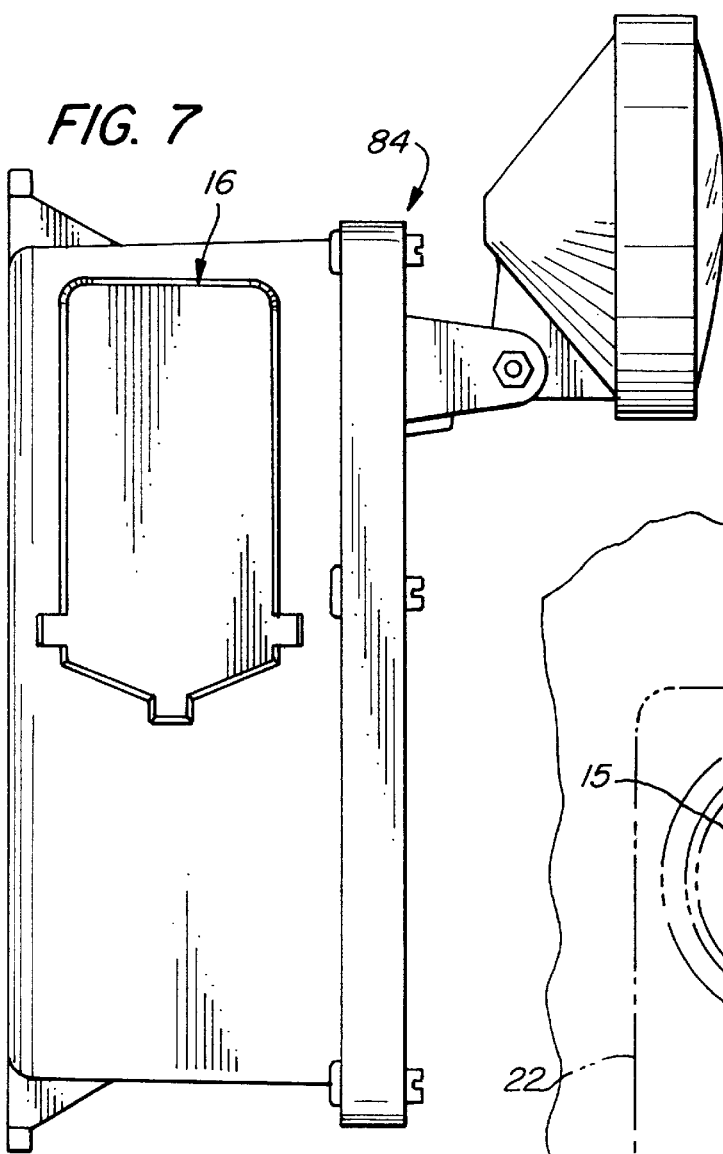
FIG. 7 is a side elevational view of an emergency light having a breather box connected thereto.

FIG. 1 illustrates an exit sign having a housing 10 forming an enclosure. The housing 10 has a side wall 12 which has a vent opening 14 (FIG. 3) therethrough. Mounted against the side wall 12 and over the vent opening is a breather box 16 in accordance with the present invention.

The breather box of the invention is best illustrated in FIGS. 2–4. It may be manufactured of molded plastic and comprises a box body 18 to which is ultrasonically welded a box cover 20. The box body comprises a base 22, an upper wall 24, a left side wall 26, a right side wall 28, a downwardly angled left half bottom wall 30 and right half bottom wall 32.

As will be clear from FIGS. 2 and 3, the left and right bottom wall halves 30 32 slope downwardly to a bottom drain opening 34. In addition, the left side wall 26 defines a left drain opening 36 therethrough, and the right side wall 28 defines a right drain opening 38 therethrough. The base 22 includes a left extension 40, a right extension 42, and a bottom extension 44. These extensions are immediately adjacent the respective left 36, right 38, and bottom 34 drain openings. Extending outwardly from each extension is a respective left 46, right 48, and bottom 50 shield wall. Each of the shield walls is adjacent to, and spaced from, a respective one of the drain openings.

Figure 5:
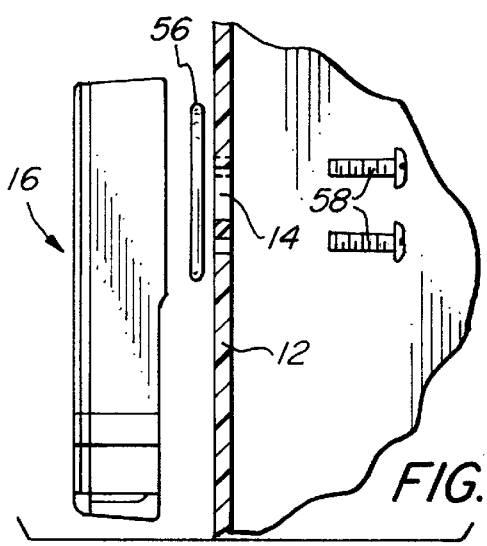
FIG. 5 is a side view, illustrating the mounting of the breather box to the enclosure.

In its upper portion, as viewed in FIG. 2, the base 22 defines an upper breather opening 52 while the bottom surface of the base 22 defines a circular groove 54 (FIG. 3) which encircles the upper breather opening 52. As shown in FIG. 3, circular groove 54 serves to hold an O-ring 56 in sealing engagement with the enclosure wall 12 when the breather box is mounted over the vent opening 14 in the side wall 12 of the enclosure. It is so mounted by means of three screws 58 (only one of which is shown in FIG. 3 and two shown in FIG. 5) which extend through the side wall 12 into bosses 60a, 60b, 60c which extend inwardly from the base 22 and radially outward from a circular wall 62 which extends to, and is sealed against, the cover 20. The circular wall 62 defines an opening 64 at its top as shown in FIGS. 2 and 4. A trough into the opening 64 is formed by an angled left wall 66 and a mirror image right wall 67. These walls 66, 67 terminate closely adjacent the upper wall 24. Also extending radially outward from the circular wall 62 are other wall extensions 68, each of which terminates in near proximity to a wall of the breather box body 18.

The lower approximately two-thirds of the breather box 16 includes a number of mostly straight wall sections which extend from the base 22 to the cover 20. These elements are best illustrated in FIGS. 2 and 4 and need not be further described. However, it will be apparent that they and a triangular structure 65 comprise a labyrinth, as generally designated by the numeral 69, in the form of a series of sharply-angled passages. Furthermore, these passages are arranged such that water attempting to ascend from one or more of the drain openings 34, 36, 38 is forced to pass through a series of restricted passages 70, followed by expansion chambers 72. This labyrinth pattern continues past the radial walls in the upper portion which similarly form constricted passages 70, followed by expansion chambers 72.

FIG. 4 illustrates the box body 18 and the cover 20 prior to assembly. Surmounting the various wall portions of the plastic box body 18 is a thin plastic bead 74 which fuses between the box body 18 and the cover 20 during the ultrasonic welding process. The cover 20 includes an inner shoulder 76 with suitable apertures 78 for receiving the wall portions of the labyrinth. The cover 20 also includes cover extensions 80, 82, 84 which weld to the corresponding shield walls 46, 48, 50.

In use, the completed breather box, when secured over the vent opening 14 in an electrical enclosure, clearly permits the passage of gas into and out of the enclosure. On the other hand, the shield walls 46, 48, 50 are a major obstacle to the entry of water into the drain openings, even under the impetus of hose pressure. Furthermore, the water head is sharply diminished as water attempts to rise past a series of sharp turns and constrictions followed by expansion chambers in the labyrinth Finally, it will be apparent from FIG. 2 that before water can enter the upper breather opening 52, it must rise to a height equal to the height sufficient to clear the upper edges of left wall 66 and right wall 67. In other words, it must substantially completely fill the breather box.

Figure 6:
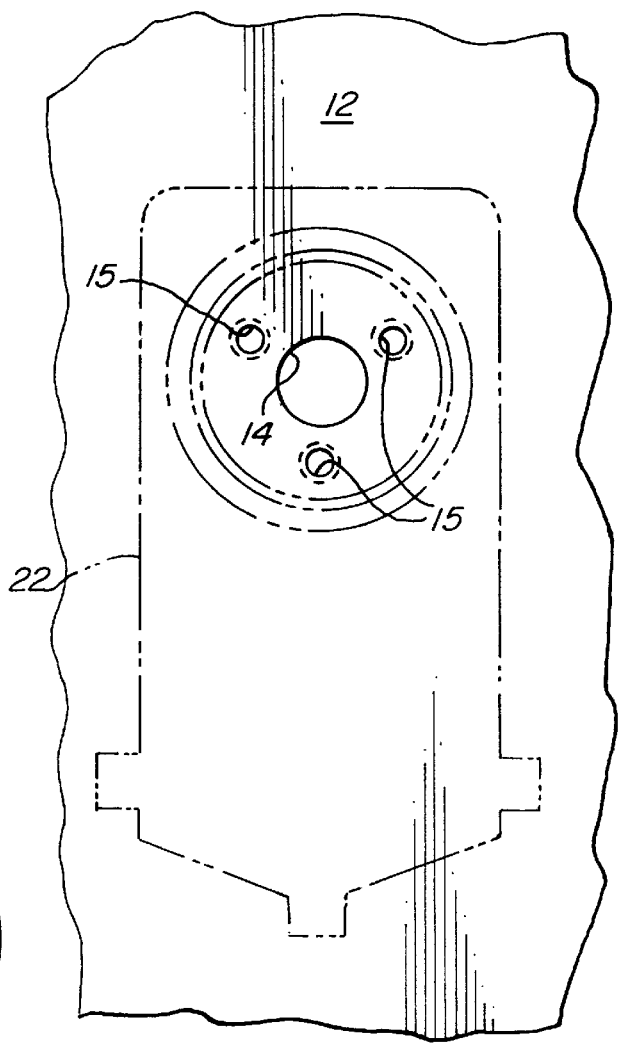
FIG. 6 illustrates a portion of the enclosure wall and vent opening showing the placement of the breather box thereto.

FIG. 6 illustrates the positioning of the breather box base 22 relative to the vent opening 14 and mounting holes 15 in the side wall 12 of an electrical enclosure. FIG. 7 illustrates the breather box 16 mounted to the side of an emergency light 84.

It will now be apparent to those skilled in the art that a number of variations and modifications may be made in the invention without departing from its spirit and scope. Accordingly, the foregoing description is illustrative only, rather than limiting. This invention is limited only by the scope of the following claims.

What is claimed is:

1. A breather vent box for use with an electrical housing forming an enclosure, the electrical housing having at least one substantially vertical wall defining a vent opening therein for admitting and discharging gases and ambient air, comprising:

an upper breather opening in said box sealable to said vent opening in fluid flow relationship therewith;
   a lower breather opening in said box communicating with said ambient air;
   a plurality of walls within said box forming a labyrinth ascending from said lower breather opening to said upper breather opening; and
   a shield including a wall external of said box positioned adjacent to, and spaced from, said lower breather opening in blocking relationship to liquid flow into said lower breather opening but permitting liquid flow out of said lower breather opening.

2. The breather vent of claim 1 wherein said labyrinth extends above said upper breather opening and forms a liquid exit opening adjacent said upper wall breather opening when said base is so secured to said vertical wall; and a shield in the form of a wall external of said box positioned adjacent to, and spaced from, said lower breather opening in blocking relationship to liquid flow into said lower breather opening but permitting liquid flow out of said lower breather opening.

3. The breather vent of claim 2 wherein said labyrinth is characterized by a series of sharp turns and by multiple flow constrictions, each constriction being followed, relative to an ascending fluid, by an expansion chamber.

4. The breather vent of claim 1 including a plurality of lower breather openings, each of said lower breather openings having a shield wall associated therewith.

5. The breather vent of claim 4 wherein said labyrinth extends above said upper breather opening and forms a liquid exit opening adjacent said upper wall.

6. An electrical apparatus for use in a hostile environment which comprises:

(a) an electrical housing forming an enclosure, said housing having a vent opening therein for admitting and discharging gases and ambient air; and
   (b) a breather vent for preventing ingress of liquids into said enclosure, said breather vent being a box having an upper wall positioned above said vent opening said box having:
      (i) an upper breathed opening in said box sealed to said vent opening and in fluid flow relationship therewith;
      (ii) a lower breather opening in said box communicating with said ambient air;
      (iii) a plurality of walls within said box forming a labyrinth ascending from said lower breather opening to said upper breather opening; and
      (iv) a shield including a wall external of said box positioned adjacent to, and spaced from, said lower breather opening in blocking relationship to liquid flow into said lower breather opening but permitting liquid flow out of said lower breather opening.

7. The apparatus of claim 6 wherein said labyrinth extends above said upper breather opening and forms a liquid exit opening adjacent said upper wall.

8. The apparatus of claim 7 wherein said labyrinth is characterized by a series of sharp turns and by multiple flow constrictions, each constriction being followed, relative to an ascending fluid, by an expansion chamber.

9. The apparatus of claim 6 including a plurality of lower breather openings, each of said lower breather openings having a shield wall associated therewith.

10. The apparatus of claim 9 wherein said labyrinth extends above said upper breather opening and forms a liquid exit opening adjacent said upper wall.

11. The apparatus of claim 10 wherein said labyrinth is characterized by a series of sharp turns and by multiple flow constrictions, each constriction being followed, relative to an ascending fluid, by an expansion chamber.

12. The apparatus of claim 6 wherein said electrical housing is an exit sign.

13. The apparatus of claim 6 wherein said electrical housing is an emergency light.

* * * * *

UNITED STATES PATENT AND TRADEMARK OFFICE
CERTIFICATE OF CORRECTION

PATENT NO. : 5,823,378
DATED : October 20, 1998
INVENTOR(S) : David A. Evarts et al.

It is certified that error appears in the above-identified patent and that said Letters Patent is hereby corrected as shown below:

In Column 2, line 45, "Figs. 24" should be --Figs. 2-4--.

In Column 3, line 51, after "labyrinth" --.-- should be inserted.

In Column 4, line 46, "breathed" should be --breather--.

Signed and Sealed this

Twelfth Day of January, 1999

Attest:

*Attesting Officer*     *Acting Commissioner of Patents and Trademarks*